US010170183B1

(12) United States Patent
Johnson

(10) Patent No.: US 10,170,183 B1
(45) Date of Patent: *Jan. 1, 2019

(54) METHOD OF STORING AND RETRIEVING DATA FOR A RESISTIVE RANDOM ACCESS MEMORY (RRAM) ARRAY WITH MULTI-MEMORY CELLS PER BIT

(71) Applicant: Micron Technology, Inc., Boise, ID (US)

(72) Inventor: Adam Johnson, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/102,959

(22) Filed: Aug. 14, 2018

Related U.S. Application Data

(60) Continuation of application No. 15/857,402, filed on Dec. 28, 2017, which is a division of application No. 13/855,208, filed on Apr. 2, 2013.

(51) Int. Cl.
*G11C 13/04* (2006.01)
*G11C 13/00* (2006.01)
*G11C 29/00* (2006.01)

(52) U.S. Cl.
CPC ...... *G11C 13/0069* (2013.01); *G11C 13/0004* (2013.01); *G11C 13/004* (2013.01);
(Continued)

(58) Field of Classification Search
CPC ............ G11C 13/0004; G11C 13/0007; G11C 13/0009; G11C 13/0011; G11C 13/0014; G11C 2013/0088; G11C 2013/0085
See application file for complete search history.

(56) References Cited

U.S. PATENT DOCUMENTS 5,781,483 A    7/1998  Shore
6,574,129 B1   6/2003  Tran
(Continued)

FOREIGN PATENT DOCUMENTS

CN    201480020193.5    4/2017
CN    201480020193.5    1/2018
(Continued)

OTHER PUBLICATIONS

Zhao et al., "Crossbar Architecture Based on 2R Complementary Resistive Switching Memory Cell", IEEE/ACM International Symposium on Nanoscale Architectures (NANOARCH), 2012, United States, pp. 85-92.

*Primary Examiner* — Andrew Q Tran
(74) *Attorney, Agent, or Firm* — Wells St. John P.S.

(57) ABSTRACT

Some embodiments include methods of storing and retrieving data for an RRAM array. The array is subdivided into a plurality of memory bits, with each memory bit having at least two memory cells. A memory bit is programmed by simultaneously changing resistive states of all memory cells within the memory bit. The memory bit is read by determining summed current through all memory cells within the memory bit. Some embodiments include RRAM having a plurality of memory cells. Each of the memory cells is uniquely addressed through a bitline/wordline combination. Memory bits contain multiple memory cells coupled together, with the coupled memory cells within each memory bit being in the same resistive state as one another.

21 Claims, 7 Drawing Sheets

(52) U.S. Cl.
CPC ...... *G11C 13/0007* (2013.01); *G11C 13/0011* (2013.01); *G11C 29/74* (2013.01); *G11C 2013/005* (2013.01); *G11C 2013/0088* (2013.01); *G11C 2213/32* (2013.01); *G11C 2213/79* (2013.01)

(56) References Cited

U.S. PATENT DOCUMENTS

| | | |
|---|---|---|
| 6,849,891 B1 | 2/2005 | Hsu et al. |
| 7,002,874 B1 | 2/2006 | Parris et al. |
| 7,251,165 B2 | 7/2007 | Taito et al. |
| 7,414,912 B2 | 8/2008 | Taito et al. |
| 7,428,174 B2 | 9/2008 | Taito et al. |
| 7,542,356 B2 | 6/2009 | Lee et al. |
| 7,688,620 B2 | 3/2010 | Lee et al. |
| 8,040,713 B2 | 10/2011 | Chen et al. |
| 2005/0057972 A1 | 3/2005 | Taito et al. |
| 2007/0189078 A1 | 8/2007 | Taito et al. |
| 2007/0242521 A1 | 10/2007 | Taito et al. |
| 2008/0056023 A1 | 3/2008 | Lee et al. |
| 2008/0101131 A1 | 5/2008 | Lee et al. |
| 2009/0168493 A1 | 7/2009 | Kim et al. |
| 2010/0177551 A1 | 7/2010 | Chen et al. |
| 2010/0188883 A1 | 7/2010 | Chen et al. |
| 2011/0007548 A1 | 1/2011 | Jung et al. |
| 2012/0218807 A1 | 8/2012 | Johnson |
| 2012/0257448 A1 | 10/2012 | Ong |
| 2013/0294148 A1 | 11/2013 | Johnson |
| 2014/0293674 A1* | 10/2014 | Johnson ............ G11C 13/0069 365/148 |
| 2018/0122476 A1* | 5/2018 | Johnson ............ G11C 13/0069 |

FOREIGN PATENT DOCUMENTS

| | | |
|---|---|---|
| EP | 14778923.4 | 10/2016 |
| JP | 11-96782 | 4/1999 |
| JP | 2001-43691 | 2/2001 |
| JP | 2001-57096 | 2/2001 |
| JP | 2005-116145 | 4/2005 |
| JP | 4500268 | 7/2010 |
| JP | 2014-506710 | 3/2014 |
| TW | I289884 | 11/2007 |
| TW | 103108017 | 12/2015 |
| WO | WO 2005/076280 | 8/2005 |
| WO | WO 2008/027920 | 3/2006 |
| WO | WO 2012/116186 | 8/2012 |
| WO | PCT/US2014/018218 | 6/2014 |
| WO | PCT/US2014/018218 | 10/2015 |

* cited by examiner

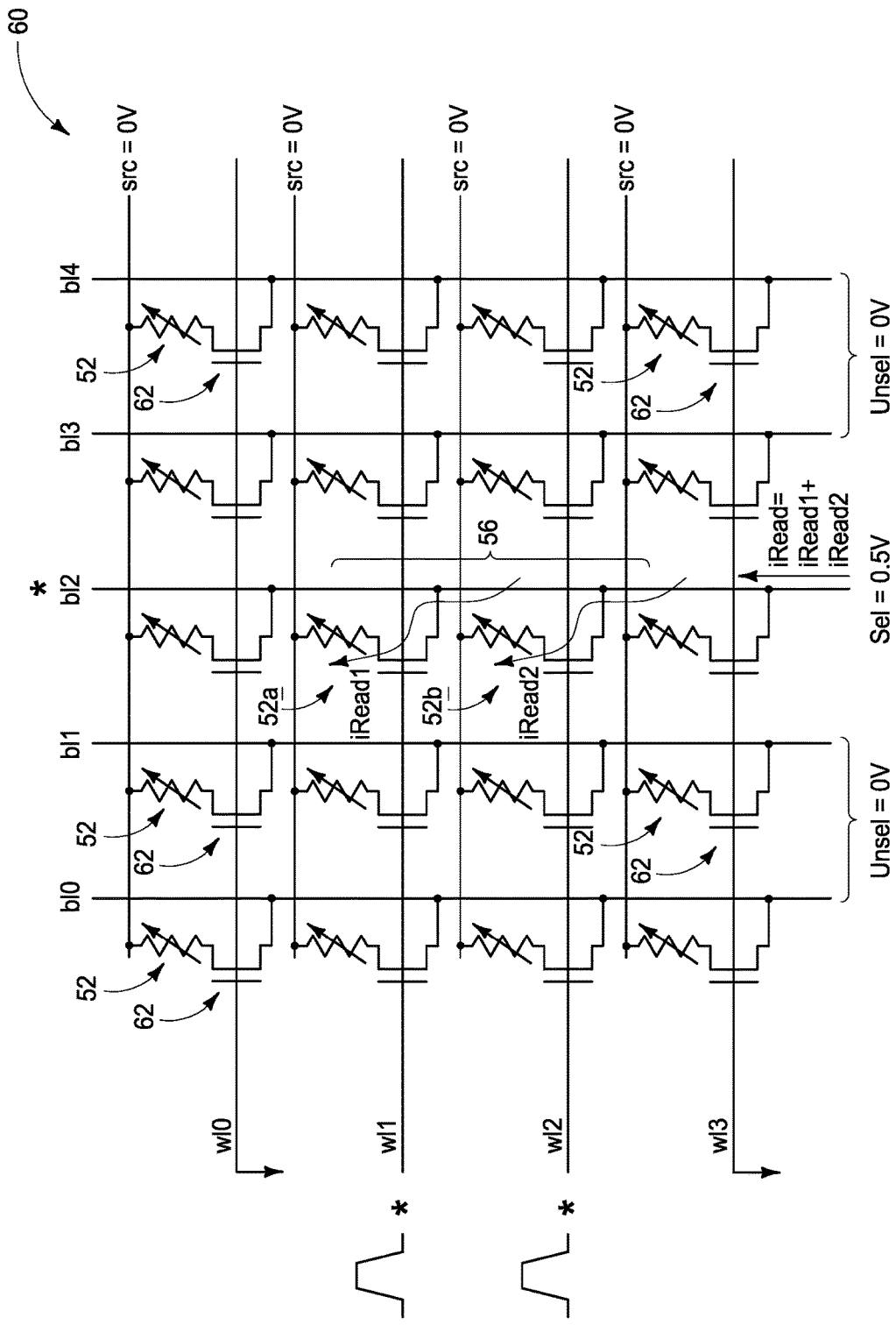

METHOD OF STORING AND RETRIEVING DATA FOR A RESISTIVE RANDOM ACCESS MEMORY (RRAM) ARRAY WITH MULTI-MEMORY CELLS PER BIT

RELATED PATENT DATA

This patent resulted from a continuation of U.S. patent application Ser. No. 15/857,402 which was filed Dec. 28, 2017, which is a divisional of U.S. patent application Ser. No. 13/855,208 which was filed Apr. 2, 2013, each of which is hereby incorporated by reference herein.

TECHNICAL FIELD

RRAM, and methods of storing and retrieving information for RRAM.

BACKGROUND

Memory is one type of integrated circuitry, and is used in systems for storing data. Memory is usually fabricated in one or more arrays of individual memory cells. A memory bit is the smallest unit of information retained in a memory array. Each memory cell may correspond to a single memory bit having two different selectable states. In a binary system, the states are considered as either a "0" or a "1".

Resistive random access memory (RRAM) is a class of memory that is of interest for utilization in existing and future data storage needs. RRAM utilizes programmable material having two or more stable states that differ in resistivity relative to one another. Example types of memory cells that may be utilized in RRAM are phase change memory (PCM) cells, programmable metallization cells (PMCs), conductive bridging random access memory (CBRAM) cells, nanobridge memory cells, electrolyte memory cells, binary oxide cells, and multilayer oxide cells (for instance, cells utilizing multivalent oxides). The memory cell types are not mutually exclusive. For example, CBRAM and PMC are overlapping classification sets.

An example prior art RRAM cell 10 is shown in FIG. 1 as transitioning between two memory states. One of the memory states is a high resistance state (HRS) and the other is a low resistance state (LRS). The memory cell comprises programmable material 16 between a pair of electrodes 12 and 14. The programmable material may be a single homogeneous composition (as shown) or may comprise two or more discrete layers.

The electrode 12 is connected to circuitry 18, and the electrode 14 is connected to circuitry 22. Circuitries 18 and 22 may include sense and/or access lines coupled to the electrodes, and configured for providing appropriate electric fields across the memory cell during read/write operations. In some embodiments, the illustrated memory cell may be one of a plurality of memory cells of a memory array, and the circuitries 18 and 22 may be part of a circuit configuration utilized to uniquely address each of the memory cells of the array. In some embodiments, a "select device" (not shown) may be provided adjacent the memory cell 10 to reduce undesired current leakage to and/or from the memory cell during utilization of the memory cell in a memory array. Example select devices include diodes, transistors, ovonic threshold switches, etc.

Application of electric field EF(+) across the memory cell 10 forms a current conducting transitory structure 20 extending through material 16. The transitory structure 20 provides a low-resistance current conduction path through cell 10; and thus formation of structure 20 transitions the cell to the LRS configuration.

Application of electric field EF(−) degrades the structure 20, and returns cell 10 to the HRS configuration. The electric field EF(−) may be of opposite polarity to the electric field EF(+).

The transitory structure 20 may have numerous configurations depending on the nature of the memory cell and of the programmable material, and depending on the chemistry and physics involved in formation of the transitory structure. For instance, the transitory structure may be a current conducting filament of ionic particles (the ionic particles may be super-ionic clusters, individual ions, etc.). As another example, the transitory structure may comprise a region of changed phase, altered vacancy concentration, altered ion concentration (for instance, altered oxygen ion concentration), etc.; which may or may not be part of a filament.

The memory cell 10 may be programmed by providing appropriate voltage across the memory cell to transition from the HRS configuration to the LRS configuration or vice versa. The memory cell may be read by providing suitable voltage across the memory cell to determine a resistance through the memory cell, while limiting the voltage to a level which does not cause programming of the memory cell.

Difficulties may be encountered during operation of memory cells of an RRAM array due to variation of operational characteristics of the cells across the array. It is desired to develop methods and structures which address such difficulties.

BRIEF DESCRIPTION OF THE DRAWINGS

FIG. 7 is a diagrammatic circuit diagram of an example embodiment reading operation for the example embodiment RRAM array of FIG. 6.

DETAILED DESCRIPTION OF THE ILLUSTRATED EMBODIMENTS

Figure 1:
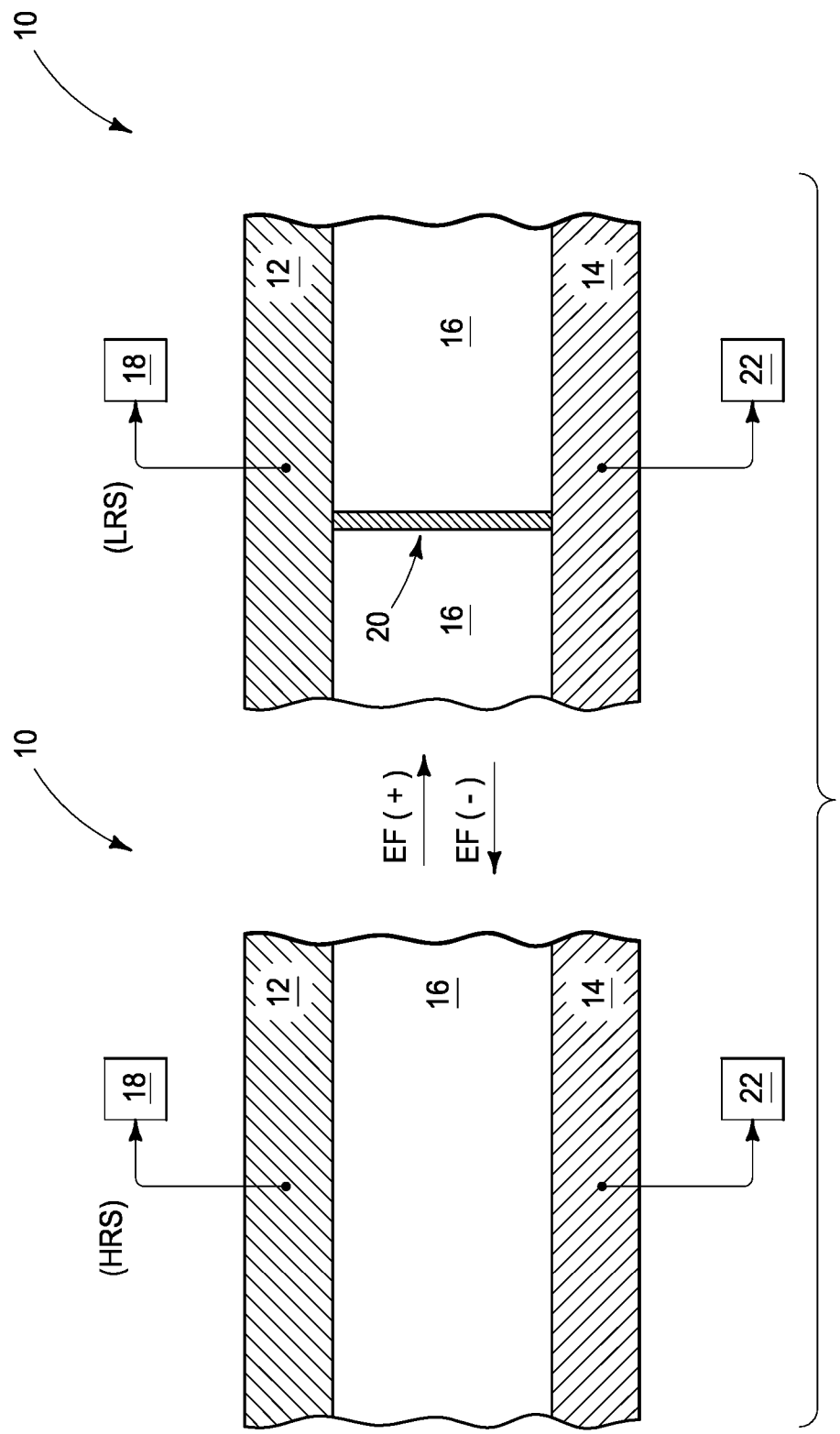
FIG. 1 diagrammatically illustrates two interchangeable memory states of a prior art memory cell.
Figure 2:
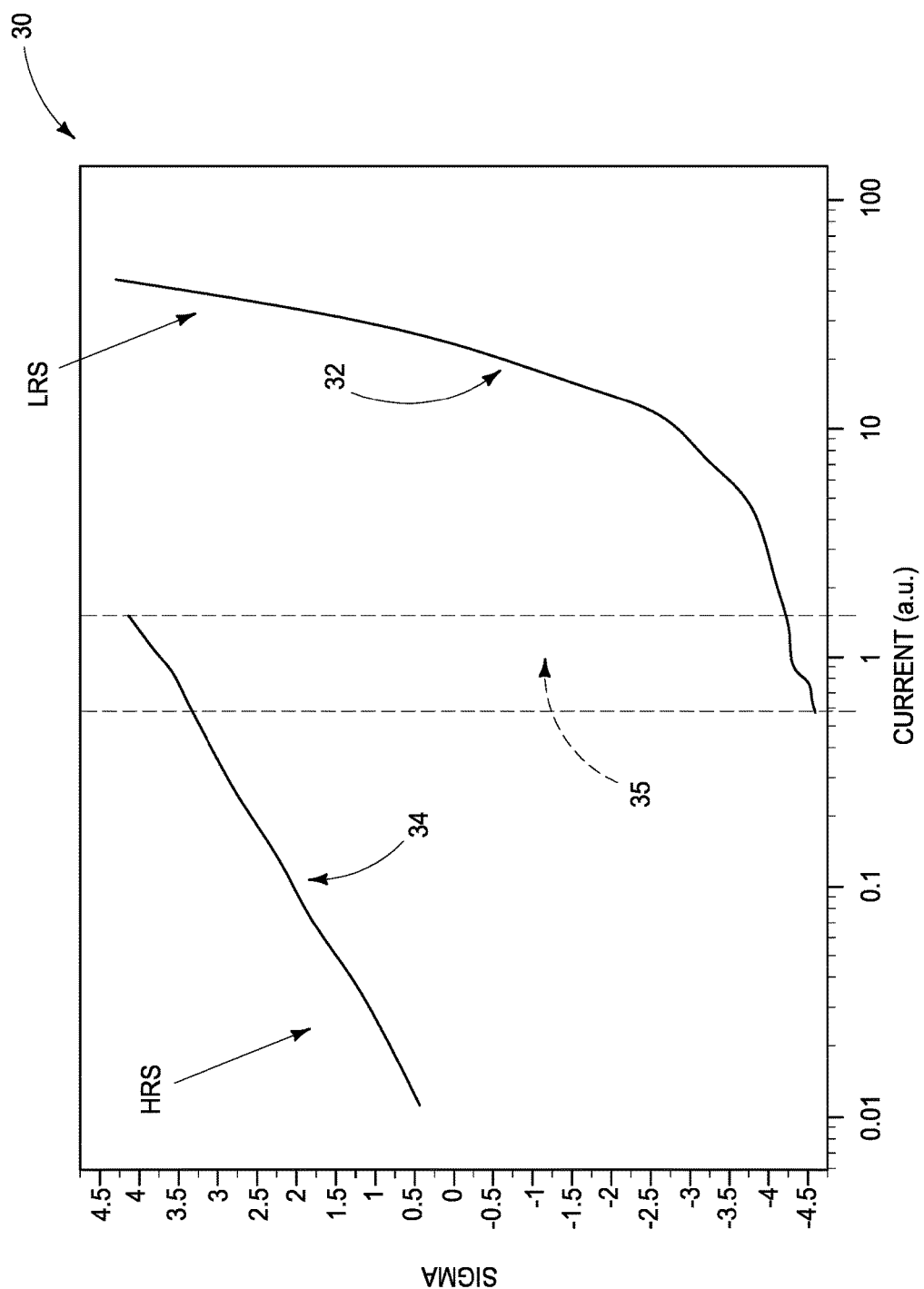
FIG. 2 graphically illustrates two populations of memory cells, with one of the populations being in a high resistance state and another of the populations being in a low resistance state.

The prior art memory cell 10 of FIG. 1 illustrates two memory states (HRS and LRS) which can be selectively programmed into the memory cell, and which ideally may be readily distinguishable from one another during a read operation. However, an RRAM array may have a large population of cells in the HRS configuration, and another large population of cells in the LRS configuration; and there may be substantial variation of the HRS and LRS characteristics of the cells across the respective populations. FIG. 2 graphically illustrates the various memory cells of an example embodiment RRAM. Specifically, FIG. 2 comprises a graph 30 plotting the property of current through individual memory cells (as measured in arbitrary units, a.u., and as shown on a logarithmic scale on the x-axis of graph 30) versus the number of memory cells in the population having such property (as delineated by sigma). Two populations of memory cells are shown on the graph, with a first population being memory cells intended to be in the LRS configuration, and shown by curve 32; and a second population being memory cells intended to be in the HRS configuration, and shown by curve 34.

The population of memory cells intended to be in the HRS configuration all have high resistance (i.e., relatively low current on the x-axis scale utilized for graph 30). In contrast, the population of memory cells intended to be in the LRS configuration encompasses a wide range of resistivity. Most of the memory cells along curve 32 have low resistivity (i.e., relatively high current on the x-axis scale utilized for graph 30). However, some of the memory cells along curve 32 have high resistivity, to the extent that there is a region 35 (diagrammatically illustrated utilizing dashed lines) at which a small number of memory cells intended to be in the LRS configuration have resistivity which overlaps with cells intended to be in the HRS configuration.

The memory cells intended to be in the LRS configuration may have high resistivity for any of several reasons. For example, such memory cells may have never fully formed an appropriate electrically conductive transitory structure (for instance, a structure analogous to the structure 20 shown in FIG. 1) associated with the LRS configuration. Alternatively, or additionally, such transitory structure may have degraded to reduce conductivity through the cells. Regardless of the reason for having memory cells intended to be in the LRS configuration with too high resistivity, such memory cells are problematic in that the high resistivity of such cells would indicate that cells are in the HRS configuration rather than in the intended LRS configuration during a read operation.

The memory cells which are intended be in the LRS configuration, but which have high resistivity (and accordingly are within the region 35) may be considered to correspond to a "tail" on the curve 32 representing the population of cells intended to be in the LRS configuration. In other words, the memory cells intended to be in the LRS configuration which have problematic high resistivity are only a small fraction of the total population of cells intended to be in the LRS configuration.

In some embodiments, a method for compensating for the high resistivity of the memory cells in the "tail" of curve 32 takes advantage of the relatively small fraction of problematic memory cells represented by such "tail". Specifically, memory bits are configured to comprise two or more memory cells. For instance, in some applications the memory bits may be configured to each comprise two memory cells coupled together. The output from the coupled memory cells is summed together during a read operation. Since the population of memory cells intended to be in the LRS configuration contains only a small fraction with problematic high resistivity, the odds favor having cells with problematic high resistivity being combined with other cells having low resistivity rather than being combined one another. The memory cells may be arranged in parallel within the memory bits so that the current through an individual memory bit is a summed total of the currents of the memory cells within the memory bit (i.e., a parallel combination of the resistivities of the memory cells within the memory bit). Accordingly, as long as one of the cells in the memory bit has low resistivity, the overall resistivity through the memory bit will be low.

A disadvantage of coupling multiple cells into individual memory bits is that the overall storage density of the memory array will be reduced. For instance, if each memory bit comprises two memory cells, then the storage density of the memory array is reduced to half of what it could be if each memory bit comprised only a single memory cell. More generally, if an RRAM array comprises X memory cells, and Y memory cells are incorporated into each memory bit, the RRAM will have no more than X/Y memory bits. In contrast, a prior art RRAM array comprising a single memory cell in each memory bit would comprise X memory bits.

The improved reliability achieved by coupling multiple memory cells into single memory bits can offset the disadvantage of reduced storage density in some applications. In some embodiments, the coupling of memory cells within each memory bit may be considered to improve signal-to-noise as compared to utilizing only single memory cells in memory bits.

Figure 3:
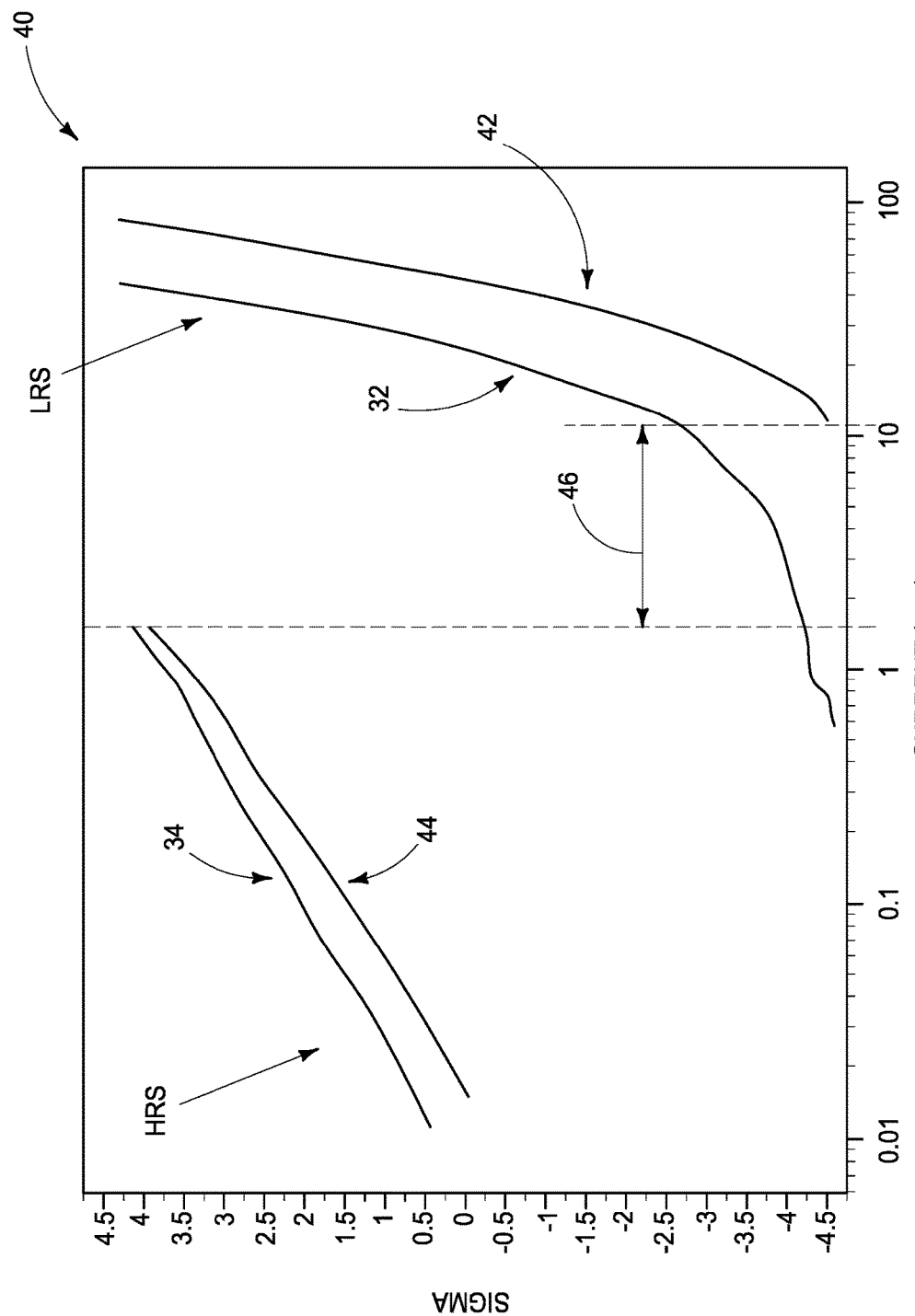
FIG. 3 graphically illustrates two populations of memory cells, and two populations of memory bits containing paired memory cells.

FIG. 3 shows a graph 40 having identical axes to the graph 30 of FIG. 2, and graphically illustrates improvement that may be achieved by coupling two memory cells into each memory bit. The two populations of memory cells described with reference to FIG. 2 are shown in the graph of FIG. 3, with one population being memory cells intended to be in the LRS configuration, and shown by curve 32; and another population being memory cells intended to be in the HRS configuration, and shown by curve 34. Also shown are two populations of memory bits, with individual memory bits containing paired memory cells and having resistivities corresponding to the parallel combination of resistivities of the paired memory cells. One of the populations of memory bits is formed by pairing memory cells from curve 32. Such population is intended to be a low resistivity state memory bit population, and is shown by curve 42. Another of the populations of memory bits is formed by pairing memory cells from curve 34. Such population is intended to be a high resistivity state memory bit population, and is shown by curve 44.

The memory bits in the high resistivity population of curve 44 all have high resistance, and the curve 44 is only modestly change relative to the curve 34 corresponding to the individual memory cells.

The memory bits in the low resistivity population of curve 42 are all of resistivity low enough to be distinguishable from memory bits in the high resistivity population of curve 44. In other words, the problematic overlap region 35 of FIG. 2 does not exist relative to the memory bit populations of curves 42 and 44; and accordingly the low resistivity memory bits of curve 42 can all be distinguished from the high resistivity memory bits of curve 44. A difference between the highest resistivity memory bit along curve 42 and the lowest resistivity memory bit along curve 44 may be considered to be a sensing window 46 suitable for determining the difference between high resistivity memory bits and low resistivity memory bits in a read operation. The coupling of multiple memory cells into individual memory bits has created a sensing window improved (i.e., widened) by at least about an order of magnitude as compared to prior art memory bits lacking coupled memory cells.

Figure 4:
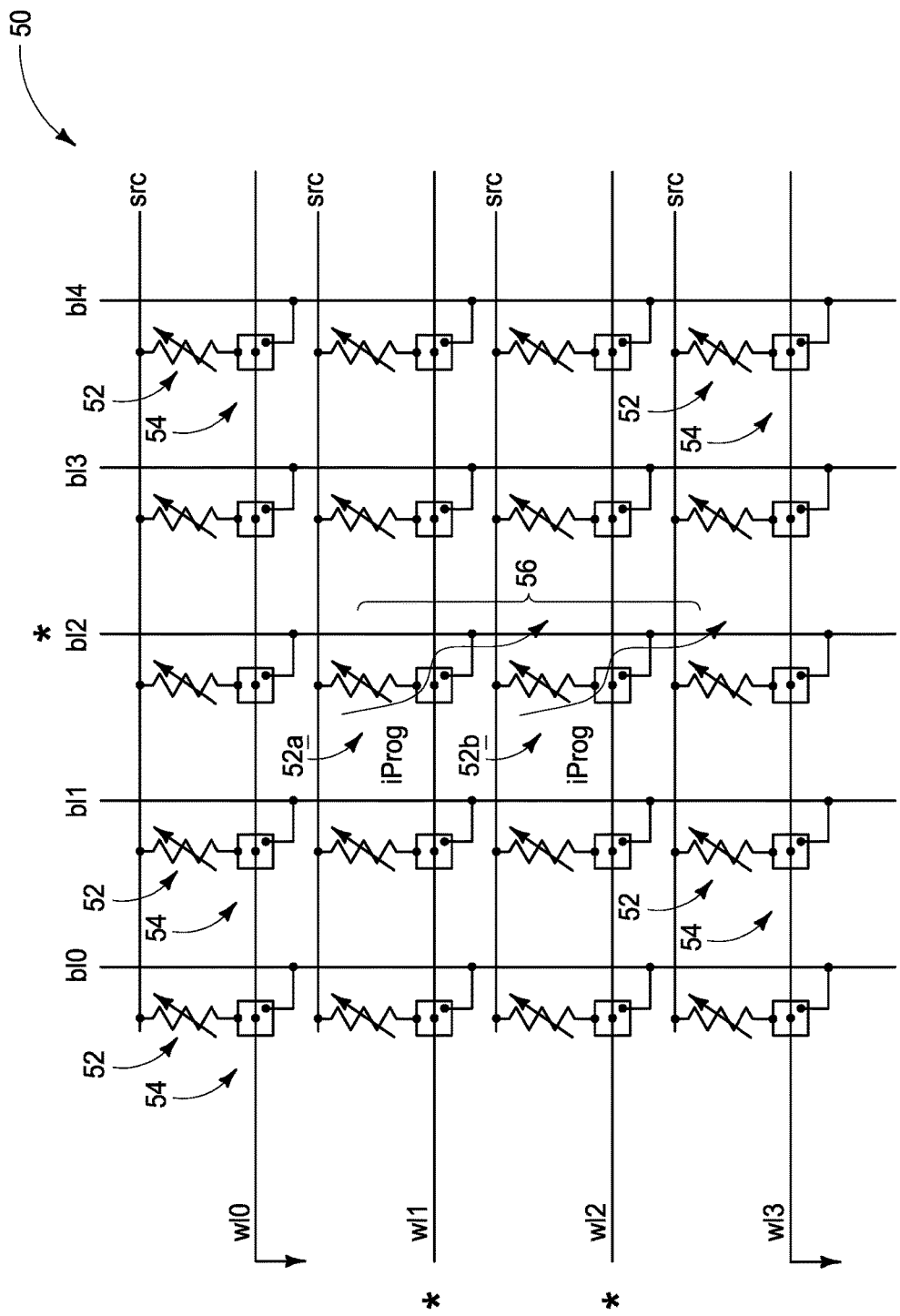
FIG. 4 is a diagrammatic circuit diagram of an example embodiment programming operation for an example embodiment RRAM array.

The memory cells may be coupled through any suitable architecture to form the memory bits of FIG. 3. FIG. 4 shows an example programming operation utilizing an architecture in which wordlines are paired to create memory bits comprising paired memory cells. The operation of FIG. 4 is illustrated utilizing a circuit diagram of a memory array 50. The memory array comprises a plurality of bitlines (b10-b14), source lines (src) and wordlines (w10-w14). The memory array comprises memory cells 52 (only some of which are labeled) represented as resistors, and comprises select devices 54 (only some of which are labeled). The select devices may be any suitable devices; including, for example, field effect transistors, bipolar junction transistors, diodes, ovonic threshold switches, etc. The select devices are provided to alleviate problematic leakage currents. In some embodiments, the select devices may be omitted if leakage currents are not problematic.

Two wordlines w11 and w12 are paired together, and an electrical pulse is provided along both wordlines as diagrammatically illustrated by an asterisk (*) at each of the wordlines. Also, an electrical pulse is provided along bitline b12 as diagrammatically illustrated by an asterisk (*) at such bitline. The electrical pulses along w11, w12 and b12 cause two of the memory cells (illustrated as memory cells 52a and 52b) to be programmed into a specific state, while the remaining memory cells are not programmed. The memory cells 52a and 52b may be programmed into the same state as one another, and specifically the resistivity of each of memory cells 52 a and 52b may be substantially simultaneously changed so that both memory cells may be substantially simultaneously programmed into an HRS configuration or so that both memory cells may be substantially simultaneously programmed into an LRS configuration. The term "substantially simultaneously" encompasses operations in which coupled memory cells are exposed to programming conditions and either program simultaneously within limitations of operation and measurement, or program not quite simultaneously due to stochastic behavior of memory cells during programming operations. In some embodiments, the coupled memory cells of a memory bit may be programmed entirely separately from one another, and thus the individual coupled memory cells may be programmed in a manner such that they are not simultaneously, or even substantially simultaneously, programmed relative to one another.

The memory cells 52a and 52b are paired together into a single memory bit 56. The other memory cells 52 may be similarly paired into memory bits. Accordingly, the array 50 may be considered to be subdivided into a plurality of memory bits, with each memory bit comprising two memory cells. Although the illustrated memory bits comprise two memory cells, in other embodiments memory bits may be configured to comprise more than two memory cells.

Figure 5:
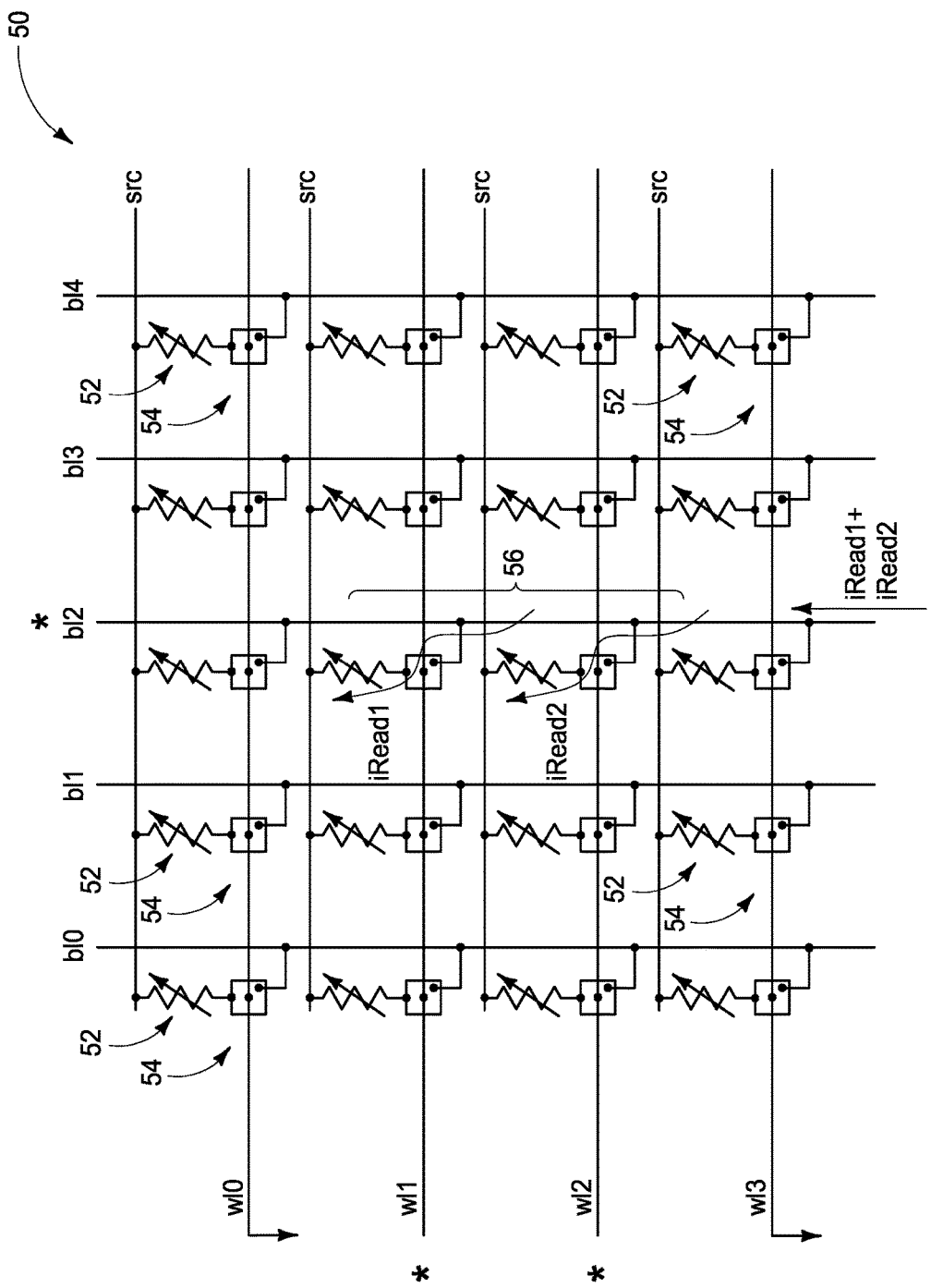
FIG. 5 is a diagrammatic circuit diagram of an example embodiment reading operation for the example embodiment RRAM array of FIG. 4.

Referring to FIG. 5, the memory cells 52a and 52b of memory bit 56 are read by providing appropriate electrical pulses along w11, w12 and b12 (as diagrammatically illustrated by asterisks (*)); with the read pulses being of suitable duration and magnitude to determine a summed current through memory cells 52a and 52b without altering a programming state of memory bit 56. The reading of the coupled memory cells may be accomplished by passing current along a path that extends through all of the coupled memory cells to thereby determine the summed current (as shown). Alternatively, in some embodiments the "coupled" memory cells may be read separately from one another (i.e., current passed through individual memory cells along paths which do not extend through all of the summed cells) and later the currents may be added together through logic (and/or through other programming circuitry or operations) to create the summed current of the coupled memory cells. Coupled memory cells of a bit may be considered to be read simultaneously with one another if current is passed along a path which extends through all of the coupled memory cells of the bit; and to be read in a non-simultaneous operation if current is passed through each memory cell of the bit and later the currents are summed together with an additional operation.

The illustrated configuration of memory array 50 has a plurality of memory cells 52 which are each uniquely addressed by the combination of a wordline and bitline. In the shown embodiment, the memory cells of memory bit 56 are addressed by paired wordlines w11 and w12 and the single bitline b12. In other embodiments, analogous memory bits may be addressed by paired bitlines and single wordlines.

Figure 6:
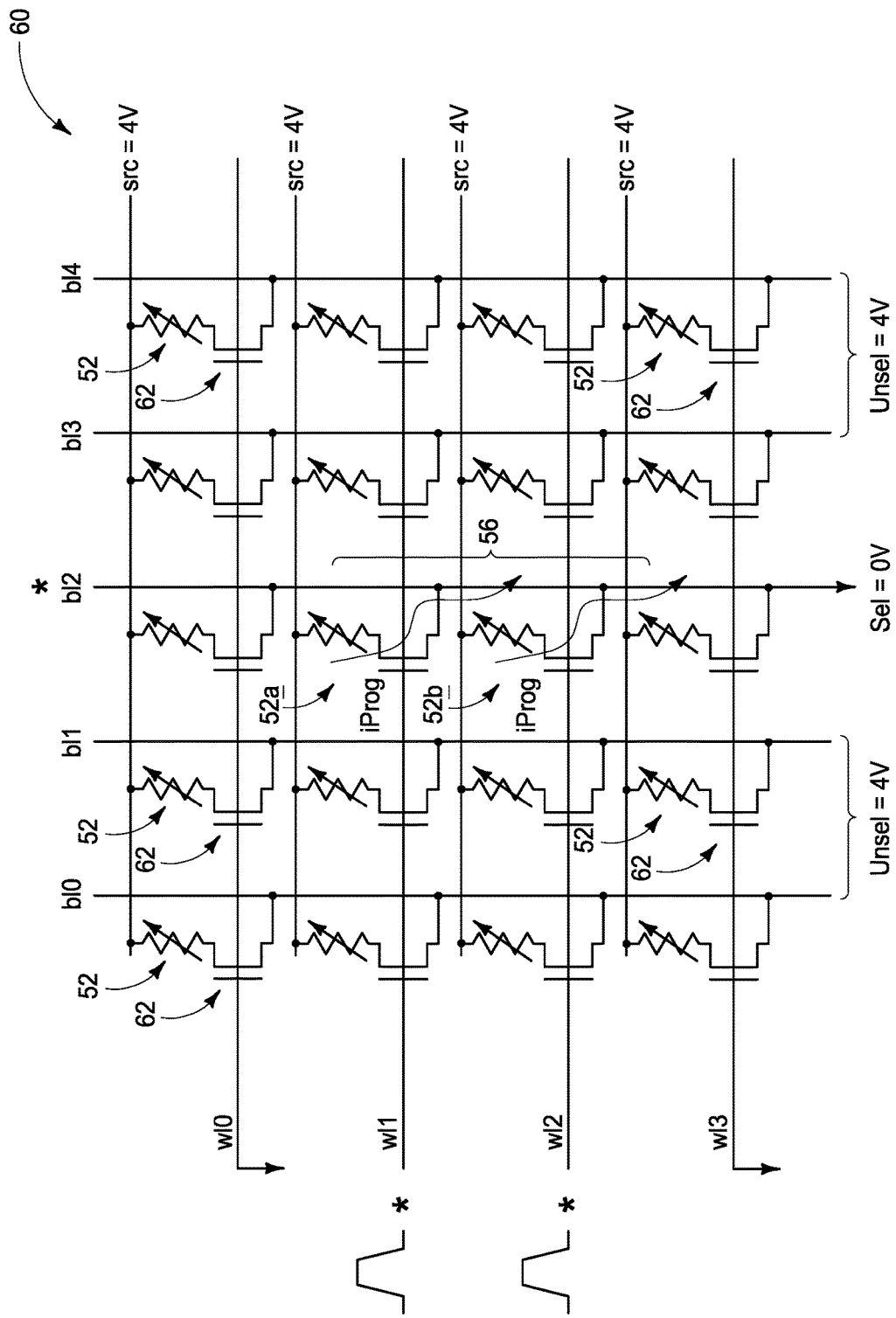
FIG. 6 is a diagrammatic circuit diagram of an example embodiment programming operation for an example embodiment RRAM array.

FIGS. 4 and 5 generically illustrate select devices 54. FIGS. 6 and 7 diagrammatically illustrate programming and reading operations, respectively, of an example embodiment memory array 60 comprising field effect transistors 62 (only some which are labeled) as the select devices. The pulses on w11 and w12 are diagrammatically shown for the programming and reading operations. The illustrated embodiment utilizes the same duration and magnitude pulse on w11 as on w12 for the programming and reading operations. In other embodiments, the pulse utilized on w11 may be different than that utilized on w12 for the programming operation, the reading operation, or both the programming and reading operations.

The memory arrays discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, clocks, televisions, cell phones, personal computers, automobiles, industrial control systems, aircraft, etc.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

Some embodiments include a method of storing and retrieving data for an RRAM array of X memory cells in which Y memory cells a coupled to one another in each memory bit so that the RRAM array has no more than X/Y memory bits. The coupled memory cells of each memory bit are maintained in a common resistive state as one another during reading and writing operations. The memory bits having coupled memory cells provide enhanced reliability as compared to memory bits having only single memory cells.

Some embodiments include a method of storing and retrieving data for an RRAM array. The array is subdivided into a plurality of memory bits, with each memory bit comprising at least two memory cells. A memory bit is programmed by substantially simultaneously changing resistive states of all memory cells within the memory bit. The memory bit is read by determining summed current through all memory cells within the memory bit.

Some embodiments include RRAM comprising a plurality of memory cells, with each of the memory cells being uniquely addressed through a bitline/wordline combination. The memory cells comprise programmable material having selectively interchangeable resistive states. Memory bits comprise multiple memory cells coupled together. The coupled memory cells within each memory bit are in the same resistive state as one another.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A method of storing and retrieving data for a resistive random access memory array, comprising:
   subdividing the resistive random access memory array into a plurality of memory bits, with each memory bit comprising more than two memory cells;
   programming an individual memory bit by substantially simultaneously changing resistive states of the more than two memory cells within the individual memory bit; and
   reading the individual memory bit by determining summed current through all memory cells within the individual memory bit, wherein each memory cell is uniquely addressed by the combination of a wordline and a bitline, and wherein all the memory cells in a memory bit are addressed by paired wordlines and an individual bitline.

2. The method of claim 1 wherein the memory cells of the individual memory bit are read simultaneously.

3. The method of claim 1 wherein the memory cells of the individual memory bit are read non-simultaneously.

4. The method of claim 1 wherein the resistive random access memory array comprises phase change memory.

5. The method of claim 1 wherein the resistive random access memory array comprises multivalent metal oxide.

6. The method of claim 1 wherein the resistive random access memory array comprises conductive bridging random access memory.

7. The method of claim 1 wherein the resistive random access memory array comprises binary oxide.

8. A method of storing and retrieving data for a resistive random access memory array, comprising:
   subdividing the resistive random access memory array into a plurality of memory bits, with each memory bit comprising at least two memory cells;
   programming an individual memory bit by substantially simultaneously changing resistive states of the at least two memory cells within the individual memory bit; and
   reading the individual memory bit by determining summed current through all memory cells within the individual memory bit, wherein each memory cell is uniquely addressed by the combination of a wordline and a bit line, and wherein all the memory cells in a memory bit are addressed by paired bitlines and an individual wordline.

9. The method of claim 8 wherein the resistive random access memory array comprises phase change memory.

10. The method of claim 8 wherein the resistive random access memory array comprises multivalent metal oxide.

11. The method of claim 8 wherein the resistive random access memory array comprises conductive bridging random access memory.

12. The method of claim 8 wherein the resistive random access memory array comprises binary oxide.

13. The method of claim 8 wherein the memory cells of the individual memory bit are read simultaneously.

14. The method of claim 8 wherein the memory cells of the individual memory bit are read non-simultaneously.

15. A method of storing and retrieving data for a resistive random access memory array, comprising:
   subdividing the resistive random access memory array into a plurality of memory bits, each memory bit comprising a set of at least two coupled memory cells with all memory bits in the array having equivalent sets;
   programming a memory bit by substantially simultaneously changing resistive states of all the coupled memory cells within the set, each individual memory bit being configured to be separately programmed relative to other of the memory bits, the programming of each memory bit including addressing the set of coupled memory cells by paired wordlines and a single bitline or by paired bitlines and a single wordline; and
   reading the memory bit by determining summed current through all memory cells within the memory bit.

16. The method of claim 15 wherein each set contains exactly two memory cells.

17. The method of claim 16 wherein the coupled memory cells of each of the individual memory bits are addressed by paired wordlines and individual bitlines.

18. The method of claim 16 wherein the coupled memory cells of each of the individual memory bits are addressed by paired bitlines and individual wordlines.

19. The method of claim 15 wherein the resistive random access memory array comprises phase change memory.

20. The method of claim 15 wherein the resistive random access memory array comprises multivalent metal oxide.

21. The method of claim 15 wherein the resistive random access memory array comprises conductive bridging random access memory.

* * * * *